United States Patent [19]

Wendt et al.

[11] 4,191,245
[45] Mar. 4, 1980

[54] HEAT DISSIPATING MOTOR MOUNTING ARRANGEMENT

[75] Inventors: Michael E. Wendt, Tyler, Tex.; Danny D. Beaver, Ft. Smith, Ark.

[73] Assignee: General Electric Company, Louisville, Ky.

[21] Appl. No.: 881,106

[22] Filed: Feb. 24, 1978

Related U.S. Application Data

[62] Division of Ser. No. 695,940, Jun. 14, 1976, Pat. No. 4,103,192.

[51] Int. Cl.² .............................................. F20F 7/00
[52] U.S. Cl. .................................. 165/69; 165/76; 62/507; 310/62
[58] Field of Search ..................... 310/42, 46, 52, 51, 310/64, 62, 60 R, 63, 91; 165/183, 169, 69, 75; 62/507, 429; 248/15

[56] References Cited

U.S. PATENT DOCUMENTS

| | | | |
|---|---|---|---|
| 1,439,990 | 12/1922 | Baldwin | 310/60 R |
| 1,989,139 | 1/1935 | Koch | 310/64 |
| 2,438,114 | 3/1948 | Dennedy | 165/183 |
| 3,127,530 | 3/1946 | White | 165/46 |
| 3,383,529 | 5/1968 | Baumann | 310/52 |
| 3,865,517 | 2/1975 | Simmons | 62/507 |
| 4,103,192 | 7/1978 | Wendt et al. | 310/91 |
| 4,105,905 | 8/1978 | Barcus | 310/42 |

FOREIGN PATENT DOCUMENTS

| | | | |
|---|---|---|---|
| 1034260 | 7/1958 | Fed. Rep. of Germany | 310/63 |
| 2405014 | 8/1975 | Fed. Rep. of Germany | 310/53 |

*Primary Examiner*—R. Skudy
*Attorney, Agent, or Firm*—Frank P. Giacalone; Radford M. Reams

[57] ABSTRACT

A motor mounting arrangement including a ring motor support member secured to the motor. The motor support member has formed integral therewith a plurality of heat dissipating fins for conducting heat away from the motor. Also formed integral with the motor support member are a plurality of arm support elements that are adapted to receive one end portion of cooperating support arms. The other end of the support arms being conveniently secured to a housing wall portion.

1 Claim, 3 Drawing Figures

U.S. Patent  Mar. 4, 1980  4,191,245
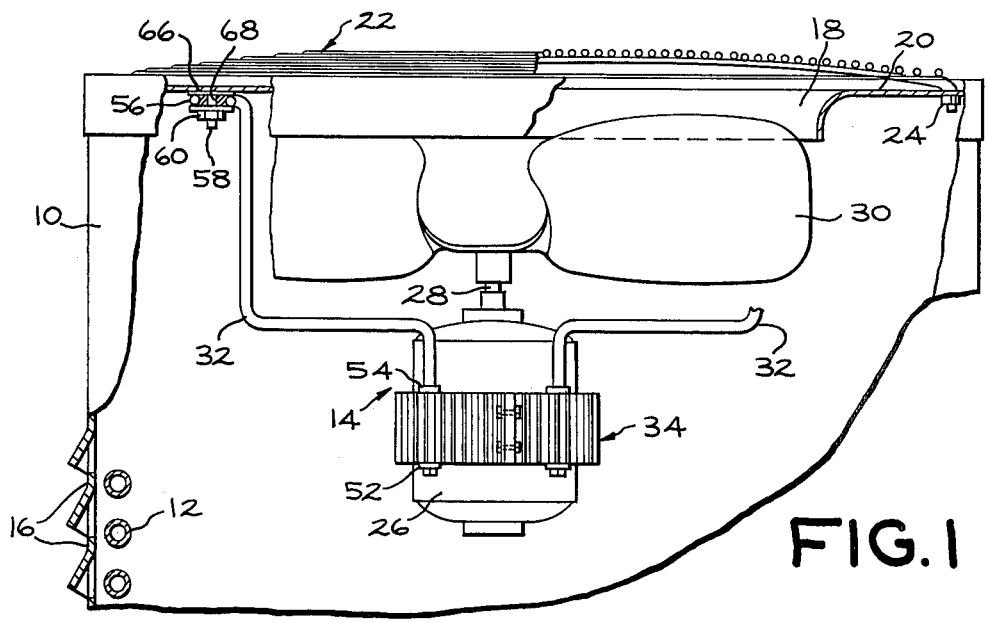
FIG.1
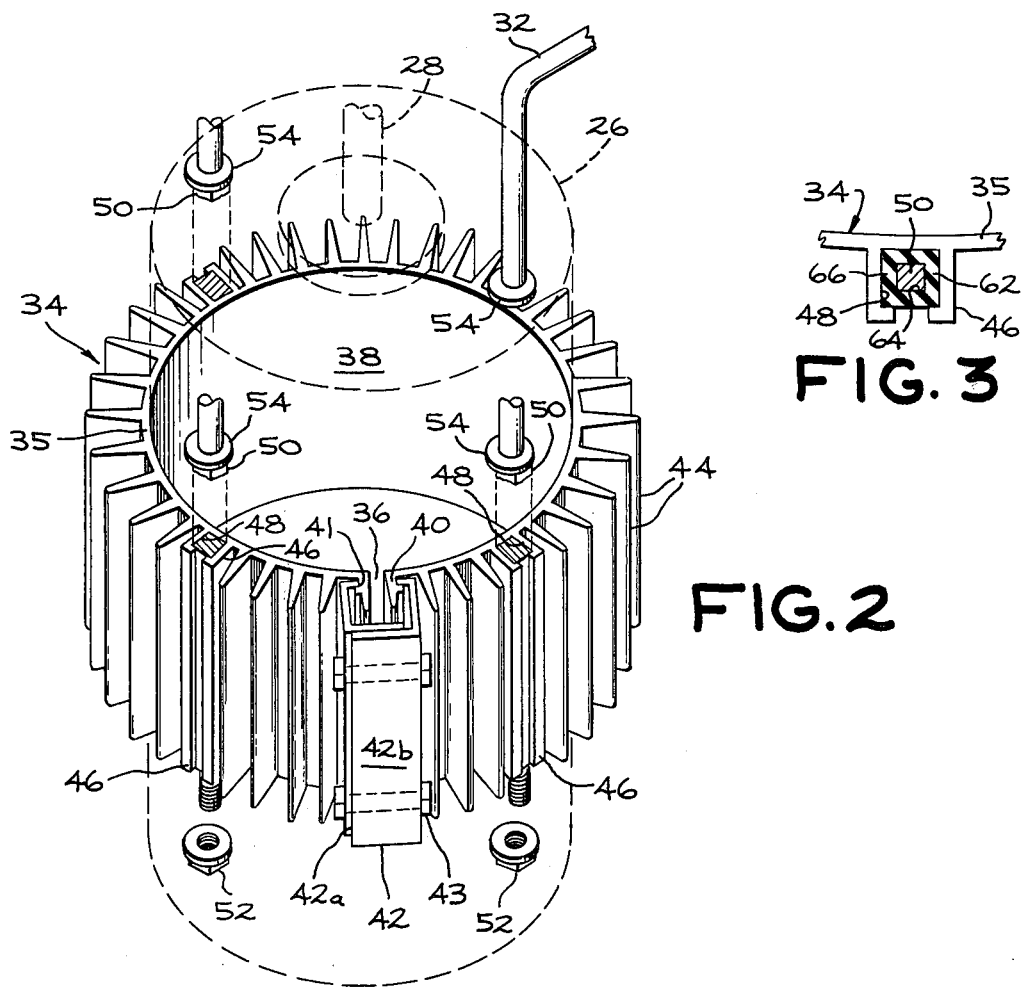
FIG.3
FIG.2

4,191,245

HEAT DISSIPATING MOTOR MOUNTING ARRANGEMENT

CROSS REFERENCE TO RELATED APPLICATION

This application is a division of copending application Ser. No. 695,940, filed June 14, 1976, now U.S. Pat. No. 4,103,192, issued July 25, 1978, for "Heat Dissipating Motor Mounting Arrangement" in the names of Michael E. Wendt and Danny D. Beaver, assigned to the assignee of this application.

BACKGROUND OF THE INVENTION

1. Field of the Invention:

This invention relates generally to an arrangement for mounting a fan motor and more specifically to a mounting arrangement for use in an air conditioning system that includes a motor support and heat dissipating ring secured to the motor.

Air conditioning systems for conditioning residences and other spaces frequently are of the type known as "split systems." Split systems comprise a refrigerant evaporator or indoor heat exchanger and associated parts disposed within the residence, and a compressor and condenser or outdoor heat exchanger which are contained in an outdoor housing. The present embodiment of the invention is shown applied to an electric fan assembly associated with the condenser which generally draws air over the condenser to remove heat from the refrigerant flowing therethrough, and discharges the warm air through a discharge opening in the housing. This added heat combined with the heat generated by the fan motor must be factored in the selection of size and type motor employed.

Generally, if motor heat can be lowered, a smaller and accordingly less expensive motor can be employed in place of the one chosen to operate at the higher temperature.

2. Description of the Prior Art:

The use of heat dissipators with fan motors is well known in the art, however, when heat dissipators are employed /they are generally expensive in that they usually require an additional step in the manufacturing operation. Another attempt at dissipating heat has been to employ motors large enough or with sufficient built-in mass to operate at particular acceptable motor temperatures which result in using oversized motors. Another standard practice is to provide the motor casing or shell with ventilating openings at both axial ends. In operation, when ventilating openings are provided, a portion of the air flows through the motor to maintain an acceptable motor temperature. However, this arrangement, because of the outdoor location of the condenser unit and motor, renders it susceptible to various sorts of damage. For example, the operation of the fan motor can be seriously impaired if moisture or dirt enter the motor bearings. The likelihood of such damage is greater in those units wherein the fan shaft extends vertically upwardly, because water and dirt can run down the shaft into the bearings. To prevent water and dirt from entering the motor through the ventilating holes, an additional shield has been mounted on the motor shaft that extends over the ventilating openings. While this arrangement protects the motor, it adds additional costs to the assembling and also impairs the free flow of air through the motor.

SUMMARY OF THE INVENTION

By this invention, there is provided a mounting arrangement for supporting a fan motor relative to an opening in a wall portion. A ring motor support member may be press fit or alternatively secured to the motor by means of a clamp. Formed integrally with the motor support member are a plurality of parallel circumferentially spaced heat dissipating means extending radially outwardly therefrom. Also formed integrally with the motor support member are a plurality of support elements that are circumferentially spaced and may be arranged equidistance around the motor support member. The present arrangement provides support arms that have one end secured in the integrally formed support elements and their other end supported in the wall portion, to centrally locate the motor relative to the openings.

It is accordingly an object of the present invention to provide a simplified motor mounting arrangement that allows the combined assembly of a heat dissipator and motor mounting member.

Other objects and features of the present invention will be apparent from the description to follow and from the appended claims.

BRIEF DESCRIPTION OF THE DRAWINGS

FIG. 1 is a partial cross sectional elevational view of an outdoor condenser unit incorporating the present invention, and FIG. 2 is a perspective view showing details of the preferred embodiment of the motor mounting arrangement.

FIG. 3 is a plan view partially in section showing a resilient member interposed to isolate the metal parts.

DESCRIPTION OF THE PREFERRED EMBODIMENT

While in the present embodiment, the invention is shown applied to the condenser section of a split type air conditioner, it should be understood that the motor mounting arrangement may be used in a number of applications including a self-contained type air conditioning unit.

Referring now to FIG. 1 of the drawings, the outdoor portion of a split air conditioning system is shown. This outdoor portion comprises a housing 10 which contains the compressor (not shown) and the condenser coil 12 of the system. Refrigerant circulating through the system absorbs heat as it passes through the evaporator located in the space being conditioned, and discharges that heat as it condenses in the condenser 12. In order to increase the rate of heat transfer from the condenser, a fan assembly 14 is provided for drawing air through inlet openings or outlet 16 in the housing 10, over condenser coil 12 to absorb heat given off by the refrigerant and to discharge the warmed air through a discharge opening or outlet 18 in the top wall 20 of the housing 10.

A grille 22 covers the opening 18 and is attached to the housing top wall 20 by means of bolts 24. The grille 22 functions primarily to prevent passage of large particles into the housing where they could damage the unit or impair its operation, and to protect persons from touching the fan assembly 14. Fan assembly 14 includes an electric motor 26 having a shaft 28 upon which is rotatably secured a fan 30. The fan assembly 14 is supported on the top wall 20 and centered relative to the opening 22 by a plurality of circumferentially spaced supporting arms 32 in a manner that will hereinafter be explained in detail.

In accordance with the fan mounting arrangement, the present invention provides means for dissipating heat from the fan assembly 14. To this end a split heat dissipating mounting ring 34 is arranged on the motor 26 which serves to remove heat from the motor, while, also making attachment points available for the support arms 32 to provide the motor mounting arrangement of the present invention. In the preferred embodiment shown the ring 34 is intended to be an extrusion of aluminum or other similar conductive material. However, it should be understood that other methods of fabricating this ring 34 may be employed in carrying out the present invention.

The ring 34 includes a main or body portion 35 and is provided with a split 36. The circumferential dimension of the inner or motor contact wall portion 38 is slightly less than the outer circumferential dimension of motor 26. Formed or extruded integral with portion 35 adjacent to, and extending along the ends defined by the split 36 are clamp flanges or support members 40 which project radially outwardly from portion 35. A two piece clamp 42 is arranged to engage the outer wall surfaces of members 38. The two pieces 42a and 42b of clamp 42 are effectively drawn together by suitable bolts 43 to force the members 40 toward each other so that the wall 38 engages the outer wall of motor 26 sith sufficient pressure to prevent relative movement between the motor 26 and ring 34. To maintain clamp 42 in engagement with the flanges 40, the ends of pieces 42a and 42b are arranged to engage a groove or recess 41 formed in the outer surface of flanges 40.

In order to insure efficient heat dissipation, it is important that firm intimate contact is maintained between the outer wall surface of the motor 26 and the inner wall surface 38 of ring 34. While the clamping arrangement described above is effective, it should be understood that other methods of maintaining intimate contact between ring 34 and motor 26 may be employed, such as press fitting, or heat shrinking a continuous or endless ring 34 to the motor 26.

The means for dissipating heat from motor 26 include a plurality of fins 44 which are substantially parallel to each other and the rotational axis of the motor, and radiate outwardly from the body portion 35. As is clearly shown in FIG. 2, the fins 44 are formed as part of the extrusion and accordingly are an integral part of the ring 34. The exact number of fins, their shape and dimensions, may be determined by anyone skilled in the art so that the necessary heat conduction is achieved for a given fan design.

As mentioned hereinbefore, means are also provided by the present invention so that the support arms 32 are attached to the ring 34 of the fan assembly 14. To this end, spaced around the circumference of ring 34 are four arm support elements 46, however, it should be noted that any number of elements spaced around the circumference of ring 34 may be employed.

Each of the elements 46 which are substantially parallel to the fins 44 are formed to provide a channel or passageway 48 for receiving an end portion 50 of arm 32. As shown in FIG. 2, the end portion 50 is shaped to conform to the shape of channel 48 which are four-sided in the embodiment shown so as to prevent axial rotational movement of support arm 32 relative to ring 34. The portion 50 is defined by a collar 54 which engages one end of element 46 and the threaded free end for receiving a nut 52 which engages the other end of element 46 to secure portion 50 of arm 32 against axial movement in passageway 48. With reference to FIG. 1, it will be seen that arms 32 generally extend radially outwardly from ring 34 and then axially over the fan 30 with its outer end 56 attached to the upper wall portion 20. To this end the ends 56 are formed to receive a bolt 58 which extends from portion 20 and are secured thereto by nuts 60.

Generally the arms 32 provide a flexible mounting arrangement that may be relatively noise free, however, with reference to FIG. 3, there is shown a mounting means for effectively isolating the motor from the housing 10. To this end a resilient member 62 is provided with a passageway 64 to receive the end portion 50. The member 62 may be longer than passageway 48 to completely isolate portion 50 from element 46 and motor 26. To complete the isolation of motor 26 from housing 10, a resilient member 66 is inserted in the end 56 of arm 32 with bolt 58 extending through centrally located hole 68 in member 66.

The foregoing is a description of the preferred embodiment of the invention and variations may be made thereto without departing from the true spirit and scope of the invention, as defined in the appended claims.

What is claimed is:

1. A refrigeration condenser unit comprising:
    a housing having inlet openings arranged in at least one side of said housing and an outlet arranged in a top wall in said housing and a condenser in said housing arranged in air flow relationship with said openings and said outlet, a fan motor arranged for passing air through said openings between said housing and the ambient surroundings;
    a split ring motor support member on said motor having an inner portion dimensioned to embrace the outer wall surface of said motor;
    holding means formed integral with said support member being arranged on the end portions of said ring adjacent said split;
    clamping means engaging said holding means for urging said end portions toward each other so that the inner contact portion of said support member is maintained in engagement with the outer surface of said motor with sufficient pressure to prevent relative movement therebetween, and to provide a low resistance thermal conductive path between the motor and the motor support member;
    a plurality of parallel circumferentially spaced heat dissipating means being formed integral with said motor support member projecting radially outwardly and extending substantially the full axial dimension of said support member;
    support arms including a first end having a non-circular cross section secured to the motor support member at spaced intervals around the circumference thereof and having their other end attached to the wall portion adjacent housing opening so as to center the rotational axis of said motor relative to said opening;
    arm support elements formed integral with said motor support member and arranged substantially parallel to said heat dissipating means;
    a non-circular passageway extending through said support elements for receiving said first end of said support arm in mating relationship to secure said arm to said motor support member;
    a resilient member arranged between said first end of the support arm and said support element passageway for absorbing vibration between said motor support member and said support arms.

* * * * *